(12) United States Patent
Lee et al.

(10) Patent No.: US 9,148,127 B1
(45) Date of Patent: Sep. 29, 2015

(54) MULTI-CARRIAGE IMPEDANCE TUNER WITH SINGLE LEAD SCREW

(71) Applicant: Maury Microwave, Inc., Ontario, CA (US)

(72) Inventors: Byung Lee, Corona, CA (US); Gary R. Simpson, Fontana, CA (US); Sathya Padmanabhan, Glendora, CA (US)

(73) Assignee: Maury Microwave, Inc., Ontario, CA (US)

( * ) Notice: Subject to any disclaimer, the term of this patent is extended or adjusted under 35 U.S.C. 154(b) by 0 days.

(21) Appl. No.: 14/724,079

(22) Filed: May 28, 2015

Related U.S. Application Data

(60) Provisional application No. 62/006,708, filed on Jun. 2, 2014.

(51) Int. Cl.
*H03H 7/38* (2006.01)
*H03J 1/06* (2006.01)
*H03H 7/40* (2006.01)

(52) U.S. Cl.
CPC ... *H03J 1/06* (2013.01); *H03H 7/40* (2013.01)

(58) Field of Classification Search
CPC .......................................................... H03H 7/40
USPC ..................................... 333/17.3, 263, 32, 33
See application file for complete search history.

(56) References Cited

U.S. PATENT DOCUMENTS

| 6,850,076 | B2 * | 2/2005 | Tsironis | 324/637 |
| 7,034,629 | B2 | 4/2006 | Tsironis | |
| 2003/0122633 | A1 * | 7/2003 | Tsironis | 333/17.3 |
| 2012/0049970 | A1 * | 3/2012 | Simpson | 333/17.3 |

* cited by examiner

*Primary Examiner* — Stephen E Jones
(74) *Attorney, Agent, or Firm* — Larry K. Roberts (57) ABSTRACT

An impedance tuner having an RF transmission line, with a single lead screw extending along the RF transmission line. A plurality of movable carriages are engaged with the lead screw, wherein each of the plurality of movable carriages is configured for independent movement relative to other carriages. A motorized drive system drives the plurality of movable carriages independently along the lead screw.

18 Claims, 9 Drawing Sheets

MULTI-CARRIAGE IMPEDANCE TUNER WITH SINGLE LEAD SCREW

BACKGROUND

Impedance tuners are often used for testing, tuning and calibration of electronic devices. Also, impedance tuners are the most common method for radio frequency (RF) and microwave (MW) amplifiers to be tested for measurement of performance. Impedance tuners can be used on load-pull and noise measurements at microwave and millimeter-wave frequencies.

An impedance tuner includes a transmission line, such as a slabline, coaxial line, or waveguide. Placement of capacitive objects such as probes along the transmission line alters the impedance or electronic profile seen by the device under test (DUT) which is connected or coupled to the tuner transmission line. The object may be placed axially along the transmission line to affect the phase, while movement of the object transverse to the transmission line will alter impedance magnitude or gamma effects. In automated tuners, motors are used to position the capacitive objects along the transmission line and transverse to the transmission line.

Multi-harmonic automated tuners incorporate multiple carriages to perform measurements on both the fundamental frequency and harmonic frequency simultaneously. The fundamental frequency is the basis for the multi-harmonic automated tuners. A harmonic frequency is a multiple of the fundamental frequency whose cycle fits within the span of the fundamental frequency cycle. An example would be the 2nd harmonic, which completes two frequency cycles within the time of one fundamental frequency cycle.

Setting different impedance points at a harmonic frequency cannot be done with the same carriage used to set the fundamental frequency impedance points. Therefore, adding additional carriages is needed. An impedance tuner with two carriages can set impedances independently at two frequencies, i.e. the fundamental frequency and a harmonic frequency. Similarly, an impedance tuner with three carriages can set impedances independently at three frequencies, i.e. the fundamental frequency and two harmonic frequencies. Each additional carriage allows one additional frequency to be tuned independently. However, adding additional carriage units will add drive unit components (i.e. motor, lead screw, lead screw nut), so manufacturing the tuner in a space confined area becomes more of a challenge. Each carriage needs to be controlled for position separately, yet accurately in ratio to the first carriage. By adding additional drive components, variables are added that may not allow the movement of one carriage to be in synchronization with another carriage.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

In the following detailed description and in the several figures of the drawing, like elements are identified with like reference numerals. The figures may not be to scale, and relative feature sizes may be exaggerated for illustrative purposes.

Figure 1:
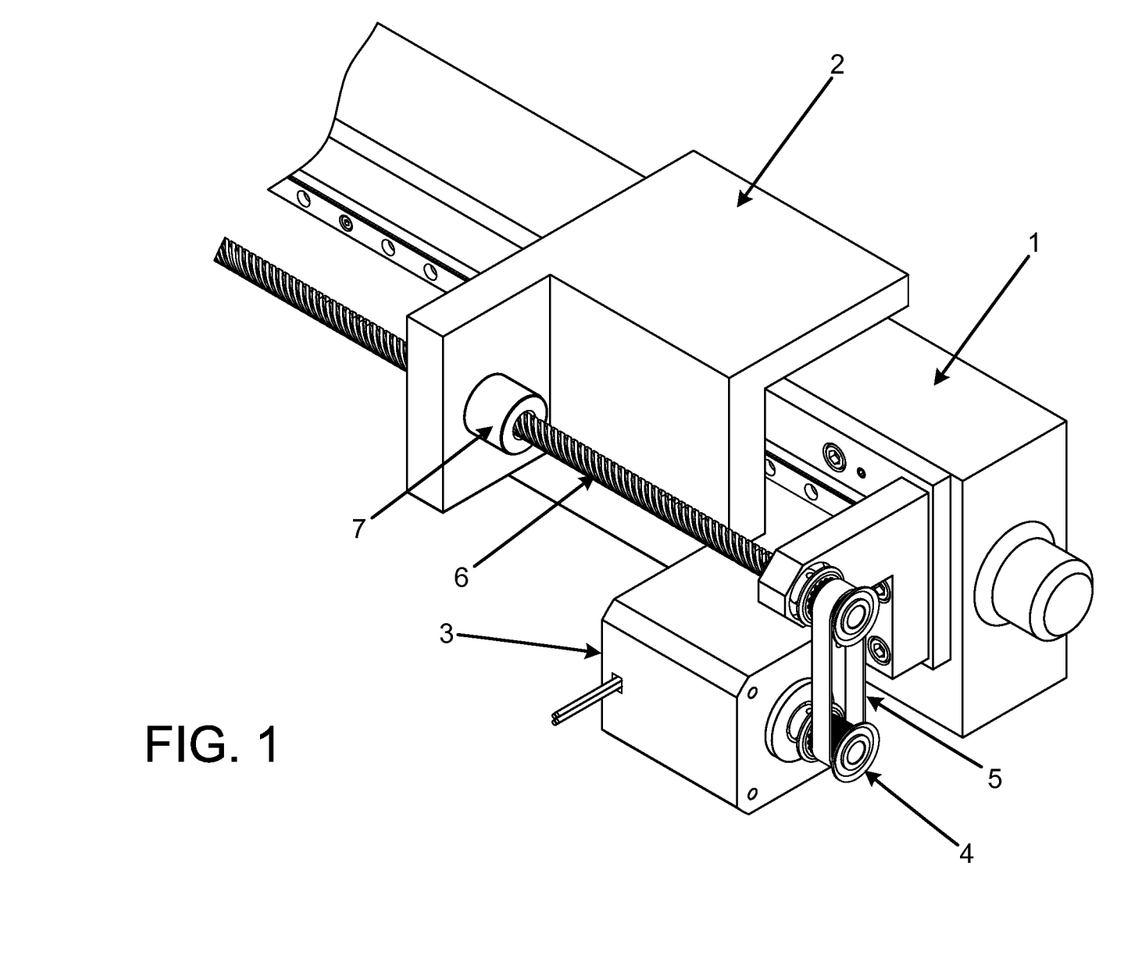
FIG. 1 shows an exemplary single carriage assembly for an impedance tuner.

FIG. 1 shows an exemplary single carriage assembly for an impedance tuner. The carriage assembly (2) is mechanically coupled to the impedance tuner (1). In this example, the carriage assembly (2) is driven by a motor (3), which rotates a timing pulley (4), timing belt (5) and transfers rotation to the lead screw (6). A stationary lead screw nut (7) is attached to the carriage unit (2) which allows for forward/reverse movement of the carriage unit (2) when the lead screw (6) is rotated. Typically, the carriages are mounted on guide rails (not shown in FIG. 1).

Figure 2:
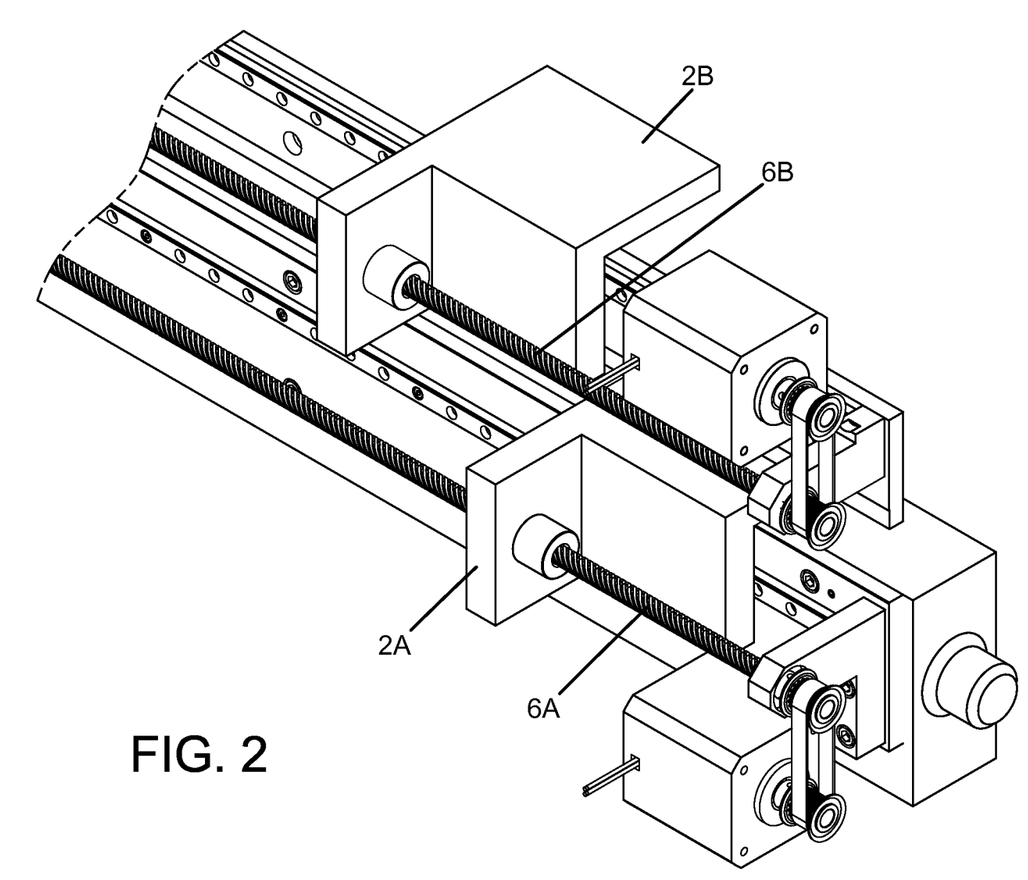
FIG. 2 diagrammatically depicts the addition of one additional carriage unit and drive components for an impedance tuner.

FIG. 2 diagrammatically depicts the addition of one additional carriage unit and drive components for an impedance tuner. Fundamental carriage (2A) is driven by leadscrew 6A, similar to the carriage assembly and leadscrew shown in FIG. 1, while harmonic carriage (2B) is an additional carriage unit driven by leadscrew 6B. This two-carriage unit can move each carriage independently along the tuner transmission line, and is used to set independent impedance points at the fundamental and harmonic frequency simultaneously. Driving the harmonic carriage (2B) will require separate drive components to move the harmonic carriage assembly (2B) to a different position from the fundamental carriage (2A) position.

FIG. 2 shows a dual unit carriage assembly with two sets of drive components. Each item that drives the carriage has its own error associated with manufacturing or operation. A list of exemplary potential errors is set out below.

(i) The pulley attached to the motor is not mounted identically concentric to the motor shaft.

(ii) The belt "teeth" which grip the pulley can slide from front to back of the tooth pocket.

(iii) The belt is made of a flexible material which can distort over time and with applied pressure.

(iv) The bearings that are used to transfer rotation from the belt to the screw shaft have errors of concentricity.

Figure 3:
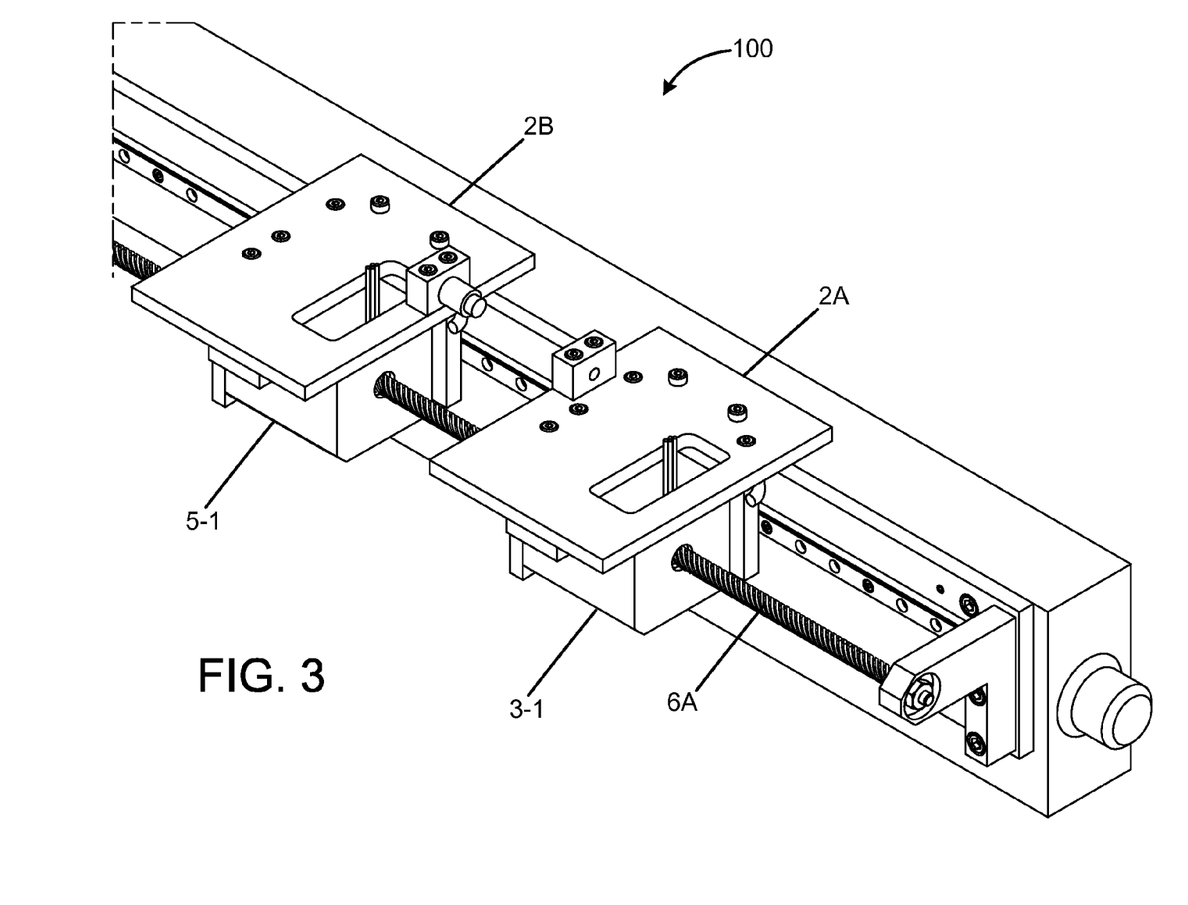
FIG. 3 shows an exemplary embodiment of a dual unit carriage assembly of an impedance tuner, using the same lead screw with multiple carriage units.

FIG. 3 shows an exemplary embodiment of a dual unit carriage assembly 100 of an impedance tuner, using the same, i.e. a single, lead screw (6A) with multiple carriage units (2A, 2B). The reduction of parts improves synchronization between the fundamental carriage and the harmonic carriage. In the embodiment of FIG. 3, motors are employed that each incorporates a lead screw nut into its rotor. This diminishes the parts needed to add multiple carriages onto the drive components of the fundamental frequency, although in another exemplary embodiment, the motor could drive a separate gear or belt drive to turn an external lead screw nut.

The fundamental carriage (2A) is driven by a motor (3-1) with a built in lead screw nut. The motor's rotor now rotates the housed nut while the lead screw (6A) is stationary. With the lead screw being stationary, a second carriage assembly (2B) can be added. The second carriage assembly is driven by its own separate motor (5-1) with built in lead screw nut but uses the same stationary lead screw (6A). The drive of the harmonic carriage does not affect the drive of the fundamental carriage and thus independent operation can occur. Thus, each of the movable carriages includes a motor coupled to the single lead screw by a corresponding lead screw nut and configured to apply rotary force to the lead screw nut to turn the nut on the leadscrew and translate the rotary force into linear movement of the nut and carriage along the single lead screw.

The embodiment of FIG. 3 employs two carriages connected to the single lead screw, but the invention is not limited to only two carriages. Any number of carriages may be connected to the same lead screw, and each carriage can move independently from all other carriages connected to the same lead screw. The independent motion can be simultaneous independent motion.

The motors employed in the embodiment 100 of FIG. 3 will typically be controlled by an impedance tuner controller, which may generate control or drive signals to drive the carriage motors as well as any probe motors mounted to the carriage to position impedance probes in directions transverse to the impedance tuner transmission line axis. Exemplary impedance tuners with electronic controllers, application software, drivers, motors and carriages are described, for example, in US 2012/0049970, entitled Systems and Methods for Impedance Tuner Initialization, the '970 publication, the entire contents of which are incorporated herein by this reference.

The multiple carriages in FIG. 3 can carry the probes of an impedance tuner, which will move along the transmission line with each carriage, and typically each carriage can also carry motors to move the probes transverse to the transmission line as well.

Figure 4A:
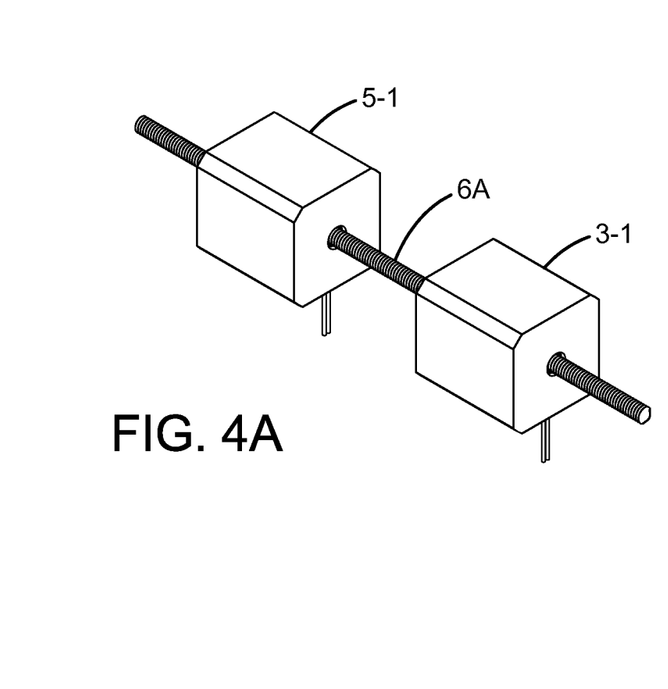
FIGS. 4A and 4B show an embodiment of two carriage motors of a multi-carriage impedance tuner on one lead screw.
Figure 4B:
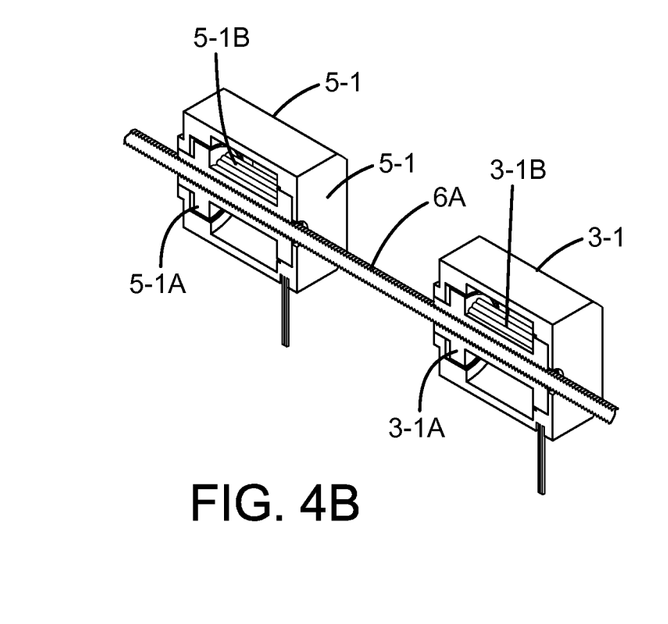
Figure 5:
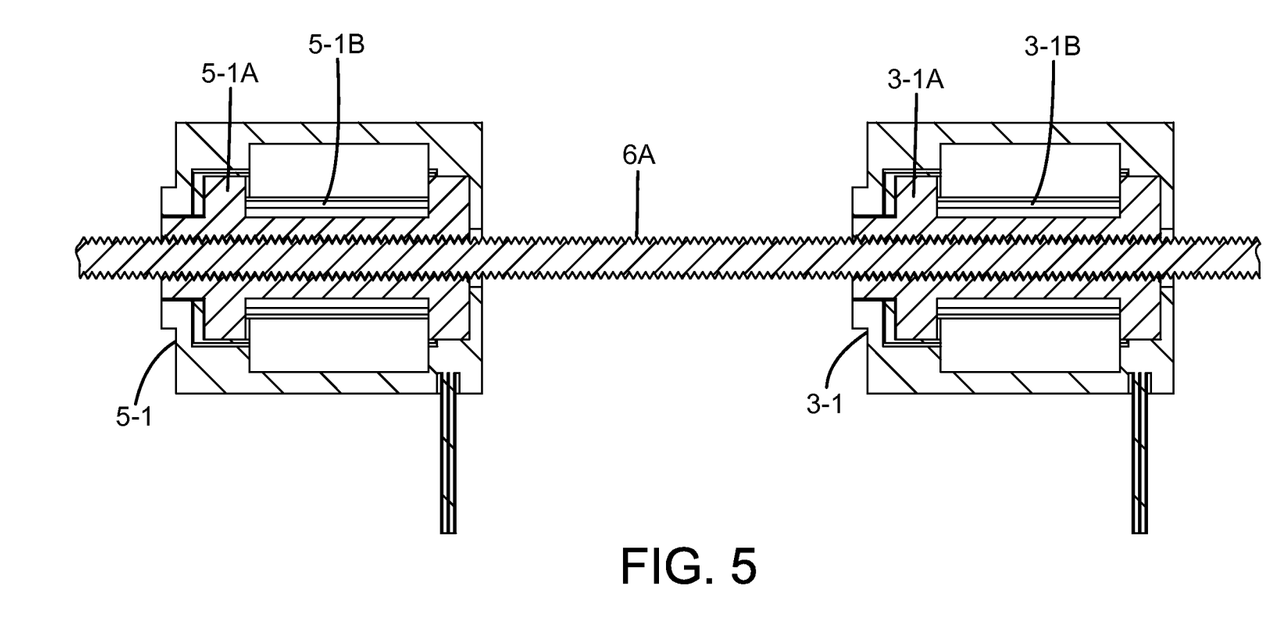
FIGS. 5 and 6 are diagrammatic cross sectional views showing the use of a lead screw nut mounted inside and driven by the motor's rotor to achieve motion of the carriage.
Figure 6:
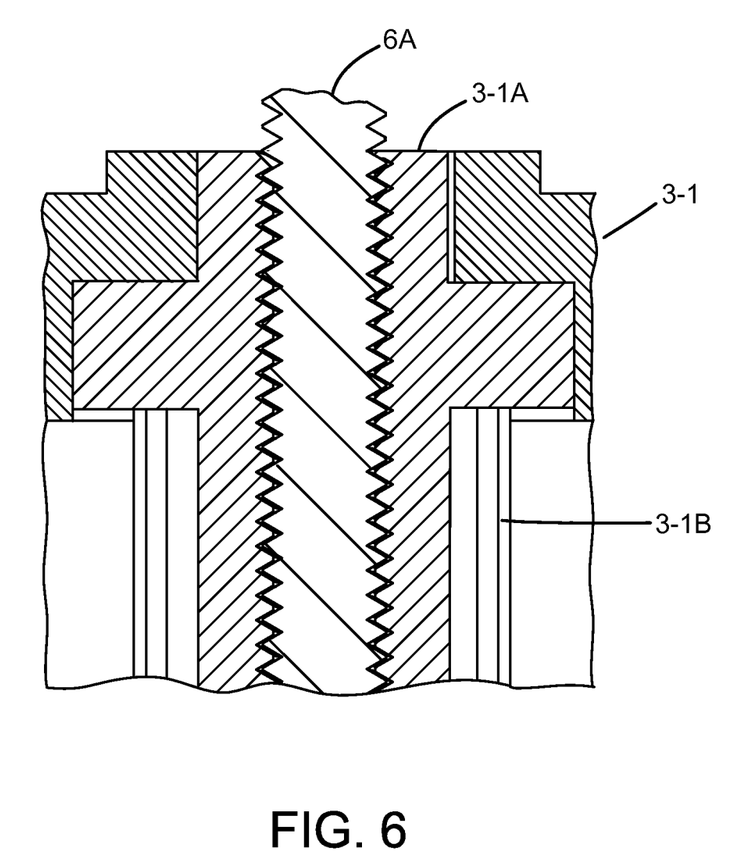

FIGS. 4A and 4B show an embodiment of two carriage motors (3-1 and 5-1) (carriage components have been hidden for clarity) on one lead screw (6A). Diagrammatic cross sectional views (FIGS. 4B, 5, and 6) shows the use of a lead screw nut (3-1A; 5-1A) mounted inside and driven by the motor's rotor to achieve motion. The nut is integrated with the rotor, in this example, as it spins with the rotor. The variance in position between the fundamental carriage (3-1) and harmonic carriage (5-1) is the sum of variance in lead screw errors. Additional errors, such as tolerances in the timing belt pulley, belt, and bearings are removed. Motors with internal lead screw nuts are commercially available.

Figure 7A:
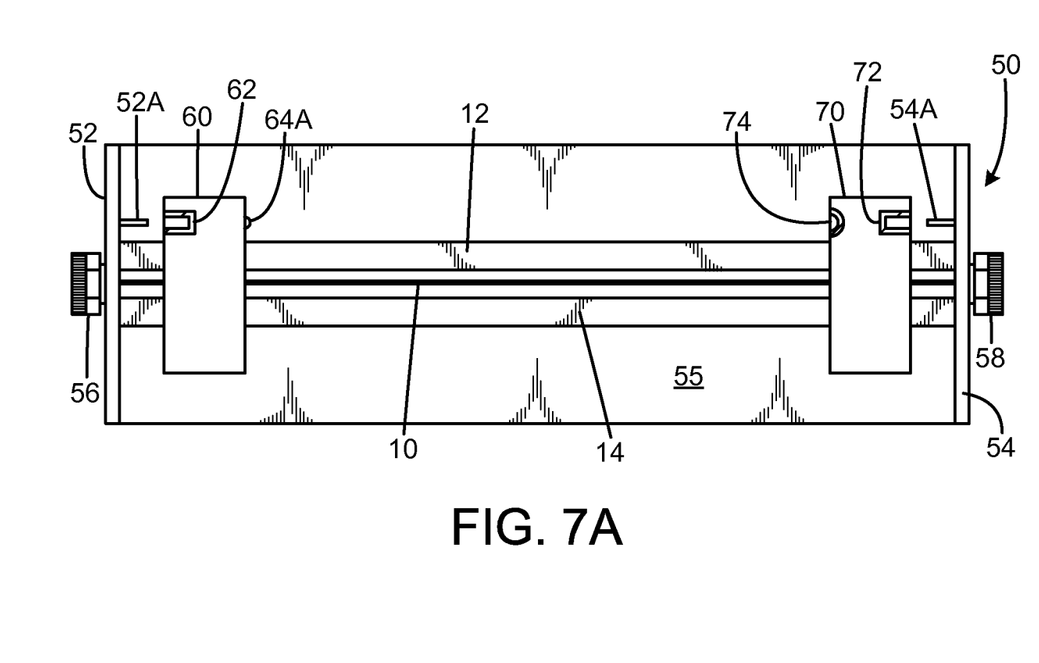
FIG. 7A illustrates an exemplary embodiment of a two-carriage impedance tuner.

FIG. 2A of the '970 publication shows an exemplary impedance tuner 50, and a corresponding diagram is set out herein as FIG. 7A. FIG. 2B of the '970 publication shows a schematic diagram of an exemplary controller/computer which controls operation of an impedance tuner such as tuner 50, and a corresponding schematic diagram is set out herein as FIG. 7B.

FIG. 7A illustrates an exemplary embodiment of a two-carriage impedance tuner 50, with carriages 60 and 70. The tuner 50 includes a pair of opposed or end walls 52 and 54 on which the center conductor 10 is supported by dielectric bushings (not shown). The end walls are mounted to a bottom plate 55. The opposed conductive ground planes 12, 14 are supported between the end walls, so that the RF transmission line in this example is a slabline which includes the center conductor and the opposed conductive ground planes. RF connectors 56, 58 are provided for making electrical connection to the center conductor on opposed sides of the tuner. Connector 56 is typically connected or coupled to a device under test (DUT).

Still referring to FIG. 7A, probe carriages 60 and 70 are mounted for movement along an axis parallel to the center conductor 10. Typically the carriages are mounted on guide rails (not shown in FIG. 7A).

Figure 7B:
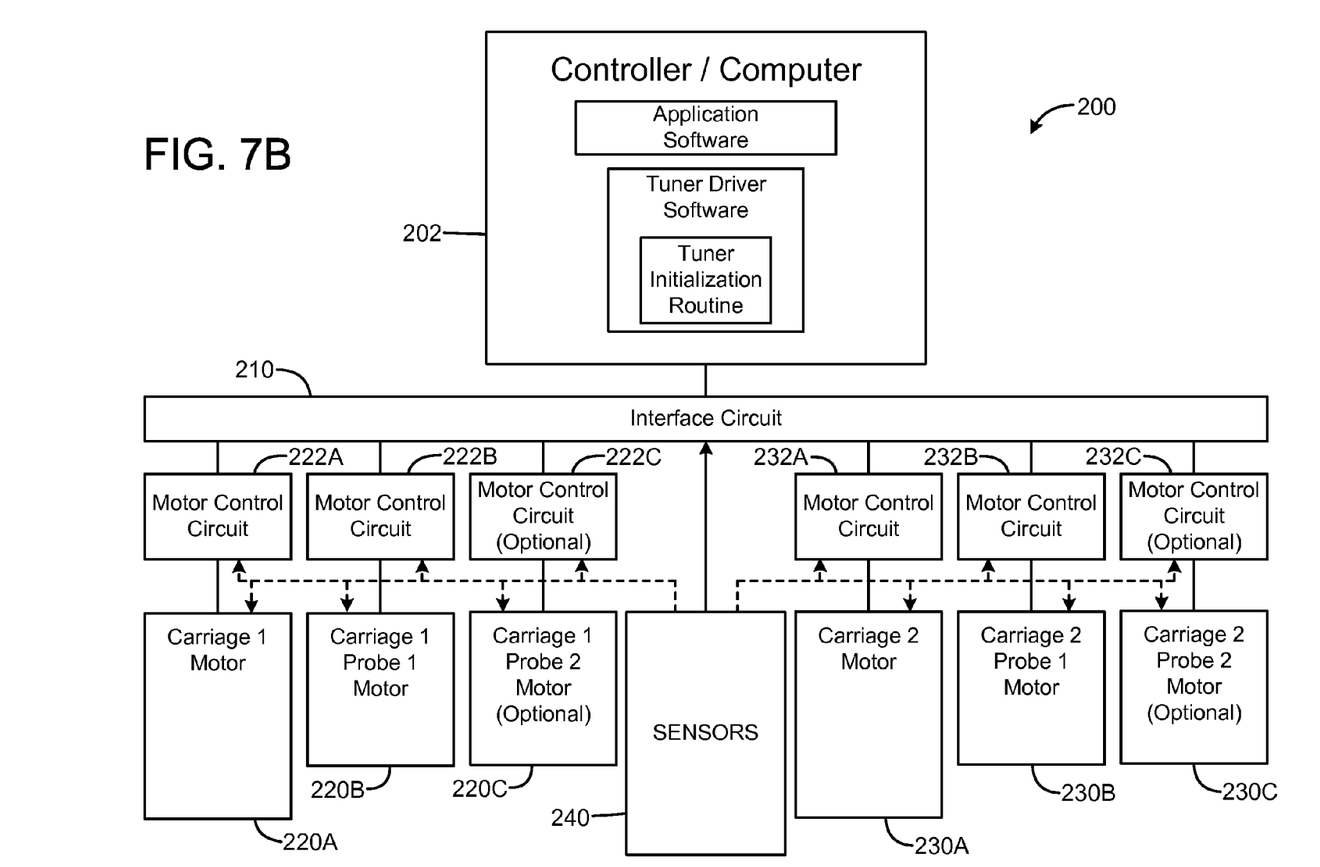
FIG. 7B illustrates a control system including a controller/computer, programmed with application software and tuner driver software.

FIG. 7B illustrates a control system 200 including a controller/computer 202, programmed with application software and tuner driver software, and sensors 240 including limit sensors. While FIG. 7B illustrates an example of a tuner control system for a two carriage system (carriage 1 and carriage 2) with two probes per carriage, the system may be used with a tuner with more than two carriages, with one or multiple probes per carriage. In the example shown in FIG. 7B, the sensors 240 include position sensors connected through the interface circuit 210 to the controller/computer, and also optionally to some or all of the motors 220A, 220B, 220C, 230A, 230B, 230C, and also to some or all of the motor control circuits 222A, 222B, 222C, 232A, 232B, 232C. The carriage 1 and 2 motors 220A, 230A are configured to move the carriages 1 and 2 parallel to the transmission line. Each carriage may include two probes and probe motors 220B, 220C, 230B, 230C, which are configured to move the respective probes in directions transverse to the transmission line. The motors may be stepper motors, although other motor types, such as DC motors, may be employed.

Figure 8:
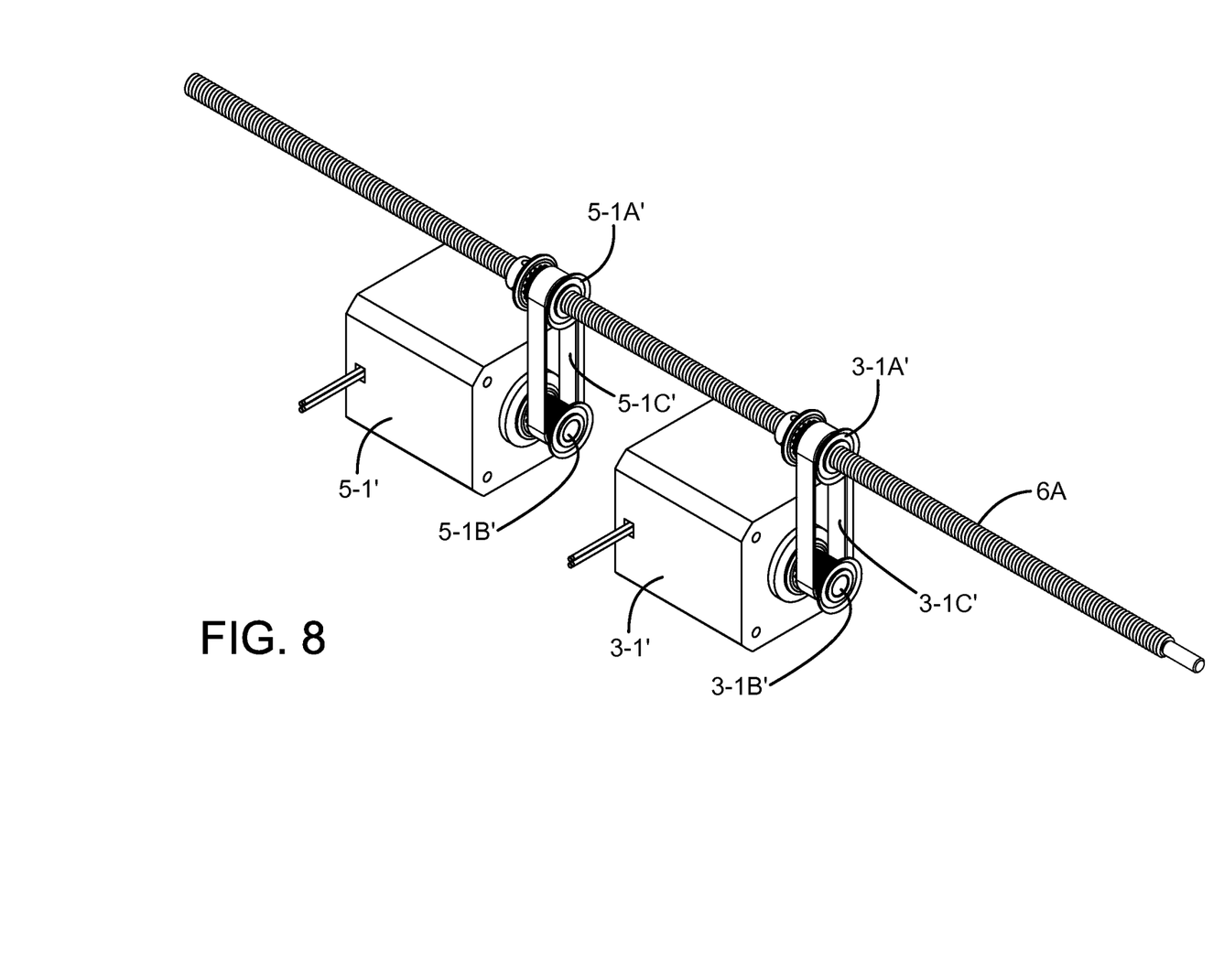
FIG. 8 illustrates an exemplary embodiment of a single screw drive system in which the motors on each tuner carriage drive leadscrew nuts external to the motors.

As noted above, the leadscrew nuts may be external to the carriage motors, for a single lead screw drive system of an impedance tuner. FIG. 8 illustrates diagrammatically an exemplary multiple carriage drive system, employing respective carriage-mounted motors 3-1' and 5-1' whose rotor shafts 3-1B' and 5-1B' drive the leadscrew nuts 3-1A' and 5-1A' through respective belts 3-1C' and 5-1C'. A suitable support system (not shown) connects the leadscrew nuts to the respective carriage, so that the motion of the nuts on the stationary leadscrew 6A results in independent motion of the respective carriages.

Although the foregoing has been a description and illustration of specific embodiments of the subject matter, various modifications and changes thereto can be made by persons skilled in the art without departing from the scope and spirit of the invention.

What is claimed is:

1. An impedance tuner having an RF transmission line, the impedance tuner comprising:
   a single lead screw;
   a plurality of movable carriages connected to said single lead screw, wherein each of the plurality of carriages connected to the single lead screw is configured for independent movement relative to other carriages to move the carriages along an axis parallel to the RF transmission line;
   a motorized drive system for independently moving the plurality of carriages along the single lead screw.

2. The impedance tuner of claim 1, wherein the plurality of carriages connected to the single lead screw is two carriages.

3. The impedance tuner of claim 1, wherein the plurality of carriages connected to the single lead screw is more than two carriages.

4. The impedance tuner of claim 1, further comprising:
   a controller coupled to the motorized drive system and configured to provide drive commands to control operation of the motorized drive system.

5. The impedance tuner of claim 1, further comprising at least one probe carried by each of the plurality of carriages and configured for motion transverse to the RF transmission line.

6. The impedance tuner of claim 1, wherein the RF transmission line is a slabline, comprising a center conductor disposed between opposed ground plane structures.

7. The impedance tuner of claim 1, wherein the lead screw does not rotate, and the motorized drive system comprises, for each of the multiple carriages, a motor on the carriage turning a nut on the lead screw.

8. The impedance tuner of claim 7, wherein the lead screw nut on the lead screw in at least one of the carriages is internal to the carriage motor.

9. The impedance tuner of claim 7, wherein the lead screw nut on the lead screw coupled to at least one of the carriages is external to the carriage motor.

10. An impedance tuner for presenting variable impedances to a device under test, comprising:
   an RF transmission line;
   a plurality of movable carriages mounted for movement along an axis parallel to the RF transmission line;
   a motorized carriage drive system configured to move each of the plurality of carriages along said axis independently, said drive system comprising:
   a single lead screw;
   each of the plurality of movable carriages including a carriage motor coupled to said single lead screw by a corresponding lead screw nut and configured to apply rotary force to the leadscrew nut to turn the nut on the leadscrew and translate the rotary force into linear movement of the nut and carriage along the single lead screw.

11. The impedance tuner of claim 10, where the lead screw nut on the single lead screw in at least one of the carriages is internal to the carriage motor.

12. The impedance tuner of claim 10, where the lead screw nut on the lead screw coupled to least one of the carriage motors is external to the carriage motor.

13. The impedance tuner of claim 10, wherein the plurality of carriages connected to the single lead screw is two carriages.

14. The impedance tuner of claim 10, where the plurality of carriages connected to the single lead screw is more than two carriages.

15. The impedance tuner of claim 10, further comprising:
   a controller coupled to the motorized drive system and configured to provide drive commands to control operation of the motorized drive system.

16. The impedance tuner of claim 10, further comprising at least one probe carried by each of the plurality of carriages and configured for motion transverse to the RF transmission line.

17. The impedance tuner of claim 10, wherein the RF transmission line is a slabline, comprising a center conductor disposed between opposed ground plane structures.

18. The impedance tuner of claim 10, where the lead screw does not rotate.

* * * * *